(12) United States Patent
Gabara et al.

(10) Patent No.: US 6,465,336 B2
(45) Date of Patent: Oct. 15, 2002

(54) CIRCUIT AND METHOD FOR PROVIDING INTERCONNECTIONS AMONG INDIVIDUAL INTEGRATED CIRCUIT CHIPS IN A MULTI-CHIP MODULE

(75) Inventors: Thaddeus John Gabara, Murray Hill; King Lien Tai, Berkeley Heights, both of NJ (US)

(73) Assignee: Agere Systems Guardian Corp., Orland, FL (US)

( * ) Notice: Subject to any disclaimer, the term of this patent is extended or adjusted under 35 U.S.C. 154(b) by 0 days.

(21) Appl. No.: 09/873,551

(22) Filed: Jun. 4, 2001

(65) Prior Publication Data

US 2001/0030361 A1 Oct. 18, 2001

Related U.S. Application Data

(62) Division of application No. 08/838,536, filed on Apr. 9, 1997.

(51) Int. Cl.[7] .............................................. H01L 21/44
(52) U.S. Cl. ........................... 438/599; 326/41; 712/11
(58) Field of Search .................................. 438/129, 598, 438/594, 618; 326/39, 40, 41; 712/11

(56) References Cited

U.S. PATENT DOCUMENTS

| | | | | |
|---|---|---|---|---|
| 5,455,525 A | * | 10/1995 | Ho et al. | 326/41 |
| 5,512,765 A | * | 4/1996 | Gaverlick | 257/202 |
| 5,581,767 A | * | 12/1996 | Katsuki et al. | 395/800 |
| 5,602,494 A | * | 2/1997 | Sundstrom | 326/39 |
| 5,760,478 A | * | 6/1998 | Bozso et al. | 257/777 |

* cited by examiner

Primary Examiner—Olik Chaudhuri
Assistant Examiner—Douglas A. Wille

(57) ABSTRACT

A multi-chip module ("MCM") and methods of operation and manufacture thereof. The MCM includes: (1) a substrate for supporting a plurality of separate integrated circuit (IC) chips thereon, (2) first and second separate IC chips mounted on the substrate, the first separate IC chip including first and second circuit portions coupled together by at least one signal conductor, and (3) interconnecting means that directly couples at least one signal conductor of the first separate IC chip to the second separate IC chip, the interconnecting means bypassing the second circuit portion of the first separate IC chip.

16 Claims, 2 Drawing Sheets

CIRCUIT AND METHOD FOR PROVIDING INTERCONNECTIONS AMONG INDIVIDUAL INTEGRATED CIRCUIT CHIPS IN A MULTI-CHIP MODULE

This Application is a Divisional of prior Application Ser. No. 08/838,536, filed on Apr. 9, 1997, currently pending, to Thaddeus J. Gabara. The above-listed Application is commonly assigned with the present invention and is incorporated herein by reference as if reproduced herein in its entirety under Rule 1.53(b).

TECHNICAL FIELD OF THE INVENTION

The present invention is directed, in general, to integrated circuits and, more specifically, to a circuit and method for providing interconnections among individual integrated circuit ("IC") chips in a multi-chip module ("MCM").

BACKGROUND OF THE INVENTION

Integrated circuits ("IC") are the tiny "chips," usually less than 0.5" on a side, of silicon (or other similar material) on which is patterned the transistors and interconnections that make modern electronic systems do what they do; compute, amplify, etc. Many advances in IC fabrication processes have brought about dramatic increases in the number of transistors that can be fabricated on each chip, thereby increasing the capabilities, as well as decreasing the size of ICs and, thus, the size of devices using ICs. Whereas the actual size of a typical IC is much less than the size of a conventional IC package, novel IC packaging designs that can significantly reduce the size of electronic devices are being explored. Moreover, as ICs become faster and more powerful, device packaging becomes a major limitation on system speed.

Conventional IC packages consist of the same basic elements: the IC, a lead frame, wire bonds, and an encapsulant. The lead frame is connected to the IC using a very thin wire bonded to both the chip and the lead frame. The encapsulant or molding, usually made from plastic, forms a package that encloses the IC, wire bonds, and part of the lead frame, thereby protecting the IC from the ambient environment. An electronic system is typically constructed from multiple packaged IC devices, which are electrically-and physically-coupled to a printing circuit board ("PCB") by leads that form a portion of the lead frame and which extend from the IC package; the PCB including metallic traces for interconnecting the multiple ICs. A relatively new approach to packaging is to place more than one IC in the same package; the multiple IC package is called a Multi-Chip Module ("MCM"), or a "hybrid" package.

MCM packages are similar to conventional single-chip package designs. MCM packages, however, house more than one IC by mounting conventional chips on a common substrate, which has metallic paths formed thereon that interconnect the individual chips. A conventional lead frame is connected to terminals on the substrate using a very thin wire, and the substrate and lead frame are then enclosed by an encapsulant to form a protective package.

The current objective in electronic systems is toward smaller, lighter, faster, portable systems; e.g., cellular telephones, pagers, notebook computers. The development of MCMs may play an important role in furthering that objective by eliminating a level of packaging for many components, facilitating the integration of multiple analog and digital technologies in a single module, reducing electromagnetic interference ("EMI") problems, and increasing the input/output ("I/O") capabilities per chip. Furthermore, chip-to-chip wiring within a MCM is cheaper and faster than PCB wiring and reduces the board area needed for a device.

In some cases, the capabilities of ICs designed for conventional single chip packages is reduced due to a desire to reduce the package size, which necessarily requires reducing the number of package leads. For example, although an IC may process data internally using a plural-conductor (i.e., "parallel") bus, the data may be serialized such that it can be communicated to another IC through only one lead. In an MCM, however, there are no leads associated with individual ICs; i.e., the ICs are coupled internally via very small metallic paths formed on a common substrate that is coupled to a lead frame. Thus, although a principle advantage of MCMs is the capability to integrate many ICs in one package, that advantage is partially diminished if it is necessary to design ICs specifically for use in MCMs, rather than using ICs designed for conventional single-chip packages.

Therefore, what is needed in the art are circuits and methods for employing conventional ICs in MCMs. There is a further need in the art for techniques of integrating conventional ICs in MCMs such that the performance of the conventional ICs is enhanced when employed in an MCM.

SUMMARY OF THE INVENTION

To address the above-discussed deficiencies of the prior art, the present invention provides an MCM and methods of operation and manufacture thereof. The MCM includes: (1) a substrate for supporting a plurality of separate integrated circuit (IC) chips thereon, (2) first and second separate IC chips mounted on the substrate, the first separate IC chip including first and second circuit portions coupled together by at least one signal conductor, and (3) interconnecting means that directly couples at least one signal conductor of the first separate IC chip to the second separate IC chip, the interconnecting means bypassing the second circuit portion of the first separate IC chip.

The present invention therefore introduces the broad concept of bypassing circuit portions associated with existing IC chips, when used in an MCM, by providing an interconnecting means that directly couples signal conductors within one IC to another IC within the MCM, rather than using the conventional bonding pads used when an IC is separately-packaged. By directly coupling to signal conductors within an IC, circuit portions of the IC can be selectively-bypassed, which may advantageously increase the overall signal processing speed and/or efficiency of the MCM.

In one embodiment of the present invention, the interconnecting means directly couples at least one signal conductor of one IC to a conventional bonding pad of a second IC. In an alternate embodiment, the second IC chip also includes first and second circuit portions coupled together by at least one signal conductor, and the interconnecting means directly couples at least one signal conductor of the first IC chip to at least one signal conductor of the second IC chip, thereby completely bypassing the conventional bonding pads of both the first and second IC chips. In effect, the internal signal conductors of the ICs are directly coupled together to form a trans-IC bus that spans the MCM. The interconnecting means, therefore, may selectively-bypass conventional bonding pads and/or circuit portions associated with conventional and existing IC chips. In this manner, conventional and existing IC chips may be suitably employed in conventional single-IC packages, as well as MCMs, without modification thereto.

In one embodiment of the present invention, the circuit portions of one or both ICs which are bypassed may be decoupled from a source of electrical power. While not necessary to the broad scope of the present invention, disabling the power to one or more of the circuit portions decreases overall power consumption by the MCM.

In one embodiment of the present invention, a first circuit portion of each of the IC chips is a clock driver circuit for providing a clock signal to a second circuit portion of each of the IC chips, the interconnecting means bypassing the clock driver of one of the IC chips whereby the second circuit portion of that IC chip receives the clock signal from the clock driver of the other IC chip. The operation of multiple IC chips within an MCM from a single clock source helps to ensure the accurate transmission of signals therebetween.

In one embodiment, described in detail hereinafter, a first IC chip includes a plural-conductor bus and a circuit portion that includes a multiplexing circuit and an output buffer, the interconnecting means directly coupling to the plural-conductor bus to thereby bypass the multiplexing circuit and output buffer of the first IC chip. In a related embodiment, a second IC chip includes a plural-conductor bus and a circuit portion that includes an input buffer and a demultiplexing circuit, the interconnecting means directly coupling to the plural-conductor bus to thereby bypass the input buffer and the demultiplexing circuit of the second IC chip. In combination, the related embodiments provide a means of bypassing the circuits necessary to serialize data communications between the ICs when the ICs are separately-packaged; the interconnecting means providing a trans-IC plural-conductor bus that spans the MCM, whereby the transmission efficiency of data between the separate ICs may be improved when employed in an MCM.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
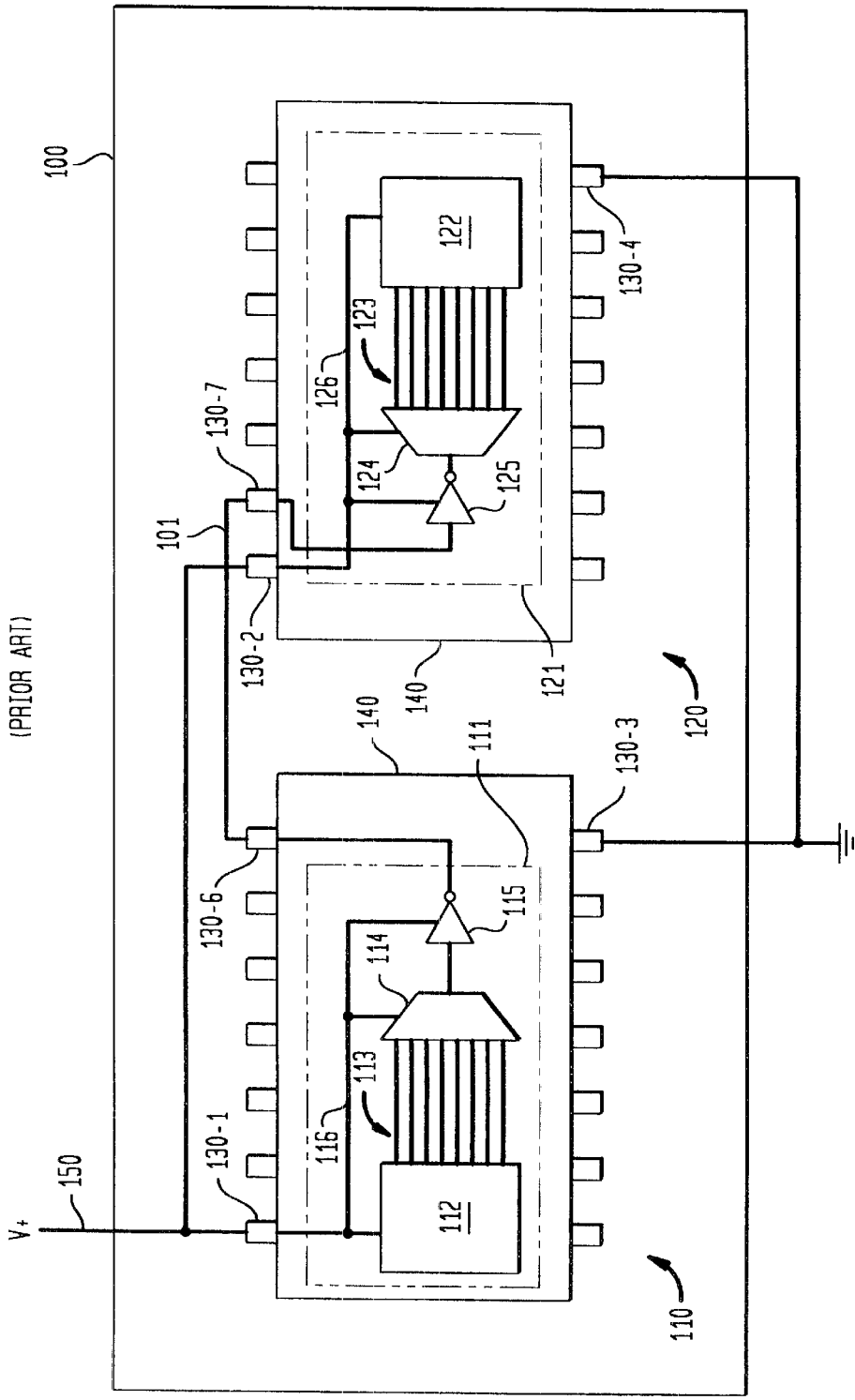
FIG. 1 illustrates an exemplary interconnection of separately-packaged integrated circuits ("IC"s) on a printed circuit board ("PCB")

Referring initially to FIG. 1, illustrated is an exemplary interconnection of exemplary conventionally-packaged integrated circuits ("IC"s) 110, 120 on a printed circuit board ("PCB") 100, according to principles known in the prior art. Conventionally-packaged ICs 110 and 120 are generally illustrated as including exemplary ICs 111 and 121, respectively, which are coupled to lead frames having a plurality of leads, generally designated as 130, which are enclosed by protective packages, generally designated as 140.; those skilled in the art are familiar with the techniques of coupling a lead frame to "bonding pads" (not shown) on an IC.

Exemplary ICs 111 and 121 include signal processing circuitry 112 and 122 (or "first circuit portions"), respectively, which may be analog or digital, or a hybrid thereof. In order to share data between ICs, exemplary ICs 111 and 121 further include plural-conductor IC buses 113 and 123, respectively; those skilled in the art are familiar with the use of plural-conductor, or "parallel," buses to share data between electrical circuits. To reduce the number of leads on a lead frame, and thus reduce the overall package size of the conventionally-packaged ICs 110, 120, exemplary ICs 111 and 121 further include serial input/output ("I/O") "ports" (or "second circuit portions") coupled to the plural-conductor IC buses 113, 123. The serial port of exemplary IC 111 is generally illustrated as an output port and includes a multiplexer 114 and an output buffer 115; the serial port of exemplary IC 121 is generally illustrated as an input port and includes an input buffer 125 and a demultiplexer 124. The output buffer 115 of exemplary IC 111 is coupled, via a bonding pad (not shown), to lead 130-6 of conventionally-packaged IC 110, and the input buffer 125 of exemplary IC 121 is coupled, via a bonding pad (not shown), to lead 130-7 of conventionally-packaged IC 120; the leads 130-6 and 130-7 are interconnected by a metallic path 101 on PCB 100, whereby data can be communicated from exemplary IC 111 to exemplary IC 121. Because of the parallel to serial conversion of the data to be transmitted between exemplary ICs 111 and 121, there may be a loss in the efficiency of data transmission. The loss in transmission efficiency, however, is often considered an acceptable trade-off for a reduced package size, which is made possible by using a single lead (e.g., leads 130-6, 130-7) or each IC for data I/O.

Electrical power is provided to exemplary conventionally-packaged ICs 110 and 120 by coupling a voltage source 150 to leads 130-1, 130-2, and a ground reference to leads 130-3, 130-4, respectively. Internal to exemplary conventionally-packaged ICs 110, 120, the electrical power is coupled to signal processing circuitry 112, multiplexer 114 and output buffer 115 by a power bus 116 on exemplary IC 111; and to signal processing circuitry 122, input buffer 125 and demultiplexer 124 by a power bus 126 on exemplary IC 121.

Figure 2:
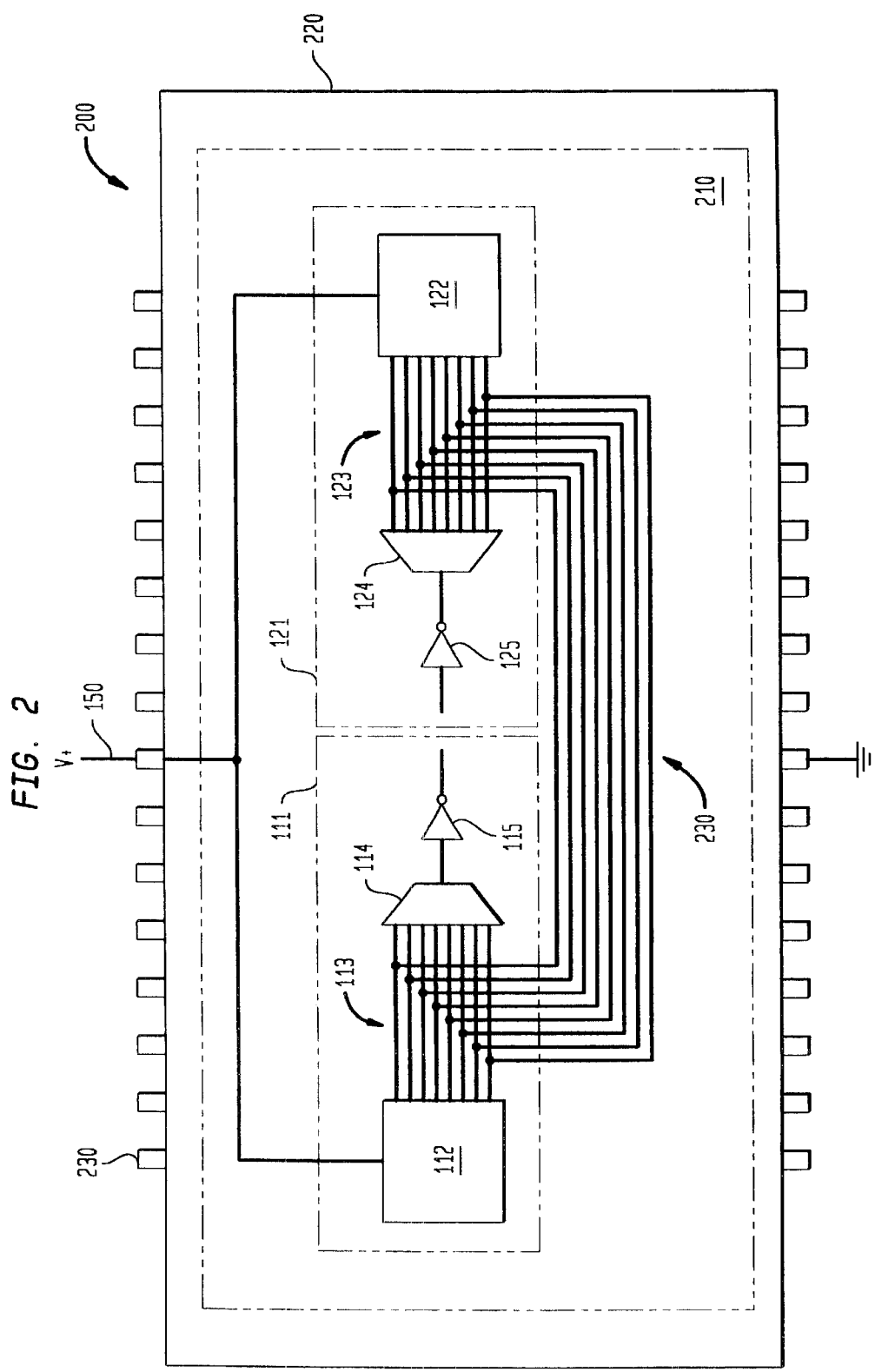
FIG. 2 illustrates an exemplary multi-chip module (MCM) including an exemplary interconnection of individual ICs according to the principles of the present invention.

Turning now to FIG. 2, illustrated is an exemplary multi-chip module ("MCM") 200 including an exemplary interconnection of exemplary ICs 111, 121, according to the principles of the present invention. MCM 200 includes a substrate 210 for supporting a plurality of individual IC chips, such as exemplary ICs 111, 121 mounted on the substrate; the substrate 210 having metallic paths formed thereon that interconnect the individual ICs. A conventional lead frame (not shown) is connected to bonding pads (not shown) on the substrate 210 using a very thin wire, and the substrate 210 and lead frame are then enclosed by an encapsulant to form a protective package 220 having a plurality of leads, generally designated as 230, extending therefrom.

The present invention introduces a circuit and method for integrating exemplary ICs 111 and 121 into exemplary MCM 200, whereby the efficiency of data communications between the ICs is improved and the total power dissipation is reduced. Whereas exemplary ICs 111, 121 are integrated onto a common substrate 210, there is no need to serialize the data associated with plural-conductor buses 113 and 123, as illustrated in FIG. 1; i.e., internal to exemplary MCM 200, there is no need to be concerned with reducing the number of signal paths because there are no package leads interposed between the exemplary ICs 111, 121. This is because the exemplary ICs 111, 121 can be directly coupled via metallic paths on substrate 210.

According to the principles of the present invention, exemplary MCM 200 further includes a plural-conductor interconnecting bus 230 (or "interconnecting means") that couples the plural-conductor IC bus 113 of exemplary IC 111 to the plural-conductor IC bus 123 of exemplary IC 121, thereby bypassing the multiplexing circuits and buffers of exemplary ICs 111 and 121 and eliminating signal latency associated therewith. In one embodiment, the plural-conductor IC bus 113 is partially comprised of metallic paths formed on substrate 210 and partially comprised of wire leads that couple individual bus conductors of plural-conductor IC buses 123, 121 to corresponding metallic paths formed on substrate 210; alternatively, the plural-conductor interconnecting bus 230 may be solely comprised of wire leads that directly couple individual bus conductors of plural-conductor IC bus 113 to corresponding individual bus conductors of plural-conductor IC bus 123. Those skilled in the art are familiar with various techniques for electrically-coupling circuits within an IC to wire leads and metallic paths formed on a substrate, such as using "flip-chip" connections or solder bumps; the principles of the present invention are not limited to a particular method of interconnection.

The present invention therefore introduces the broad concept of bypassing, for example, multiplexing circuits (e.g., multiplexer 114 and demultiplexer 124) and buffers (e.g., output buffer 115 and input buffer 125) associated with existing serial ports on IC chips by providing a plural-conductor (parallel) interconnecting bus to span the plural-conductor IC buses directly. Signal latency (delay) associated with the multiplexing circuits and the buffers are avoided, thereby increasing the overall signal processing speed of the MCM. The principles of the present invention are not limited, however, to only bypassing multiplexing and buffer circuits; the principles of the present invention may be applied to bypass any circuit portion of an IC, when used in a MCM, whereby the performance of multiple interconnected ICs may be enhanced. For example, if one or more ICs to be used in an MCM include clock driver circuits (i.e., "first circuit portions") that provide a clock signal to second circuit portions within each IC, the clock driver circuits of all but one of the ICs may be bypassed, whereby the second circuit portions of all of the ICs receive a clock signal from the clock driver circuit one of the ICs. Those skilled in the art will recognize that the operation of multiple IC chips within an MCM from a single clock source helps to ensure the accurate transmission of signals therebetween.

In the embodiment illustrated in FIG. 2, the plural-conductor interconnecting bus 230 has a number of conductors equal to the plural-conductor IC bus 113 of the IC 111 and the plural-conductor IC bus 123 of the IC 121. In effect, the conductors of the IC buses are coupled together to form a single trans-IC bus that spans the MCM. Alternatively, the present invention contemplates a multi-conductor interconnecting bus that directly couples less than all of the conductors of the IC buses, still bypassing the multiplexing circuits and the buffers.

The conductors of plural-conductor interconnecting bus 230 may be shielded or unshielded conductors; alternatively, the interconnecting means may use twisted-pairs of conductors. Because the transmission rate for data over the plural-conductor interconnecting bus 230 is not required to be as high as the transmission rate for the prior art serial bus, it may not be necessary to shield the conductors. Some applications, however, may find shielded conductors to be advantageous. Therefore, the broad scope of the present invention is not limited to unshielded conductors.

In a preferred embodiment, as illustrated in FIG. 2, the multiplexing circuits and buffers of exemplary ICs 111 and 121 are decoupled from the voltage source 150. Whereas the plural-conductor interconnecting bus 230 bypasses the multiplexing circuits and buffers, those circuits are not needed and, thus, are preferably disconnected from power buses 116 and 126 to eliminate power consumption thereby. Those skilled in the art are familiar with various methods for disabling circuits or portions of circuits in an IC. While not necessary to the broad scope of the present invention, disabling the power to one or more of the multiplexing circuits and buffers decreases overall power dissipation by the MCM.

Although the present invention and its advantages have been described in detail, those skilled in the art should understand that they can make various changes, substitutions and alterations herein without departing from the spirit and scope of the invention in its broadest form.

What is claimed is:

1. A method of operating a multi-chip module (MCM), comprising:
    processing signals within first and second separate integrated circuit (IC) chips mounted on a substrate, said first separate IC chip comprising a first portion coupled to a multiplexing circuit and a buffer by at least one signal conductor; and
    communicating said signals via an interconnecting means that directly couples said at least one signal conductor of said first separate IC chip to said second separate IC chip thereby bypassing said multiplexing circuit.

2. The method as recited in claim 1 wherein said second separate IC chip comprises first and second circuit portions coupled together by at least one signal conductor, said interconnecting means directly coupling said at least one signal conductor of said first separate IC chip to said at least one signal conductor of said second separate IC chip.

3. The method as recited in claim 1 wherein said multiplexing circuit and said buffer are disconnected from a source of electrical power to eliminate power consumption thereby.

4. The method as recited in claim 2 wherein said first circuit portion of said second separate IC chip is disconnected from a source of electrical power to eliminate power consumption thereby.

5. The method as recited in claim 2 wherein said first circuit portion of each of said first and second separate IC chips comprises a clock driver circuit for providing a clock signal to said multiplexing circuit and said buffer of said first separate IC chip and said second circuit portion of said second separate IC chip, said interconnecting means bypassing said clock driver of said second separate IC chip whereby said second circuit portion of said second separate IC chip receives said clock signal from said clock driver of said first separate IC chip.

6. The method as recited in claim 1 wherein said at least one signal conductor of said first separate IC chip comprises a plural-conductor bus.

7. The method as recited in claim 2 wherein said at least one signal conductor of said second separate IC chip comprises a plural-conductor bus and said first circuit portion of said second separate IC chip comprises an input buffer and a demultiplexing circuit, said interconnecting means thereby bypassing said input buffer and said demultiplexing circuit of said second separate IC chip.

8. A method of manufacturing a multi-chip module (MCM), comprising:

providing a substrate for supporting a plurality of separate integrated circuit (IC) chips thereon;

mounting first and second separate IC chips on said substrate, said first separate IC chip comprising a first portion coupled to a multiplexing circuit and buffer by at least one signal conductor; and directly coupling said at least one signal conductor of said first IC chip to said second IC chip with an interconnecting means thereby bypassing said multiplexing circuit.

9. The method as recited in claim 8 wherein said second separate IC chip comprises first and second circuit portions coupled together by at least one signal conductor, said interconnecting means directly coupling said at least one signal conductor of said first separate IC chip to said at least one signal conductor of said second separate IC chip.

10. The method as recited in claim 8 further comprising the step of decoupling said multiplexing circuit and said buffer from a source of electrical power to eliminate power consumption thereby.

11. The method as recited in claim 9 further comprising the step of disconnecting said first circuit portion of said second separate IC chip from a source of electrical power to eliminate power consumption thereby.

12. The method as recited in claim 9 wherein said first circuit portion of each of said first and second separate IC chips comprises a clock driver circuit for providing a clock signal to said multiplexing circuit and said buffer of said first separate IC chip and said second circuit portion of said second separate IC chip, said interconnecting means bypassing said clock driver of said second separate IC chip whereby said second circuit portion of said second separate IC chip receives said clock signal from said clock driver of said first separate IC chip.

13. The method as recited in claim 8 wherein said at least one signal conductor of said first separate IC chip comprises a plural-conductor bus.

14. The method as recited in claim 9 wherein said at least one signal conductor of said second separate IC chip comprises a plural-conductor bus and said first circuit portion of said second separate IC chip comprises an input buffer and a demultiplexing circuit, said interconnecting means thereby bypassing said input buffer and said demultiplexing circuit of said second separate IC chip.

15. A method of operating a multi-chip module (MCM), comprising:

processing signals within first and second separate integrated circuit (IC) chips mounted on a substrate, said first separate IC chip comprising a first portion coupled to a multiplexing circuit and a buffer by at least one signal conductor; and communicating said signals via an interconnecting means that directly couples said at least one signal conductor of said first separate IC chip to said second separate IC chip thereby bypassing said buffer.

16. A method of manufacturing a multi-chip module (MCM), comprising:

providing a substrate for supporting a plurality of separate integrated circuit (IC) chips thereon;

mounting first and second separate IC chips on said substrate, said first separate IC chip comprising a first portion coupled to a multiplexing circuit and buffer by at least one signal conductor; and directly coupling said at least one signal conductor of said first IC chip to said second IC chip with an interconnecting means thereby bypassing said buffer.

\* \* \* \* \*